United States Patent
Adam et al.

(10) Patent No.: US 7,157,990 B1
(45) Date of Patent: Jan. 2, 2007

(54) RADIO FREQUENCY DEVICE AND METHOD USING A CARBON NANOTUBE ARRAY

(75) Inventors: John Douglas Adam, Millersville, MD (US); Robert Miles Young, Ellicott City, MD (US)

(73) Assignee: Northrop Grumman Corporation, Los Angeles, CA (US)

( * ) Notice: Subject to any disclaimer, the term of this patent is extended or adjusted under 35 U.S.C. 154(b) by 145 days.

(21) Appl. No.: 10/850,152

(22) Filed: May 21, 2004

(51) Int. Cl.
*H03H 9/46* (2006.01)
*H03H 9/52* (2006.01)
*H03H 9/24* (2006.01)

(52) U.S. Cl. ............... 333/186; 333/200; 333/24.2; 977/723; 977/724; 977/742; 977/932

(58) Field of Classification Search ............ 333/186
See application file for complete search history.

(56) References Cited

U.S. PATENT DOCUMENTS 6,566,983 B1 * 5/2003 Shin ..................... 333/193
6,737,939 B1 * 5/2004 Hoppe et al. .......... 333/186
6,803,840 B1 * 10/2004 Hunt et al. ............ 333/186

OTHER PUBLICATIONS

Davis et al.; "High-Q Mechanical Resonator Arrays Based on Carbon Nanotubes"; IEEE Nanotechnology 2003; Aug. 2003, vol. 2, pp. 635-638.*

M. L. Roukes; "Nanoelectromechanical Systems"; Technical Digest of the 2000 Solid-State Sensor and Actuator Workshop; Hilton Head, SC Jun. 4-8, 2000, pp. 1-10.*

Poncharal et al.; "Electrostatic Deflections and Electromechanical Resonances of Carbon Nanotubes"; Science; Mar. 1999, vol. 283, pp. 1513-1516.*

J. Li, C. Papadopoulos, J. Xu: *Highly-ordered carbon nanotube arrays for electronics applications, Applied Physics Letters,* Jul. 19, 1999, vol. 75, No. 3, pp. 367-369.

W.C. Young: *Rouk's Formulas for Stress & Strain, McGraw-Hill,* NY 1975, 6th ed., p. 176.

J.W.M. Chon, P. Mulvaney, J.E. Sader: *Experimental validation of theoretical models for the frequency response of atomic force microscope cantilever beams immersed in fluids, Journal of Applied Physics,* Apr. 15, 2000, vol. 87, No. 8, pp. 3978-3988.

* cited by examiner

*Primary Examiner*—Barbara Summons
(74) *Attorney, Agent, or Firm*—Rothwell, Figg, Ernst & Manbeck

(57) ABSTRACT

A radio frequency (RF) filter includes a substrate, first and second dielectric layers formed on first and second portions of the substrate, a ground plane formed on a third portion of said substrate, a carbon nanotube array, and first and second electrodes. The third portion of the substrate includes, at least in part, the area between the first and second portions thereof. The carbon nanotube array is formed on a portion of said ground plane between the first and second dielectric layers. The first and second electrodes are formed on the first and second dielectric layers, such that an RF signal may be input to and output from the carbon nanotube array via the first and second signal guides. A third electrode is disposed over the carbon nanotube array and is used to voltage bias the array.

64 Claims, 15 Drawing Sheets

RF E-FIELD AT OPEN END OF CPW CENTER CONDUCTOR PRODUCES PERIODIC COULOMBIC FORCE ON CNT

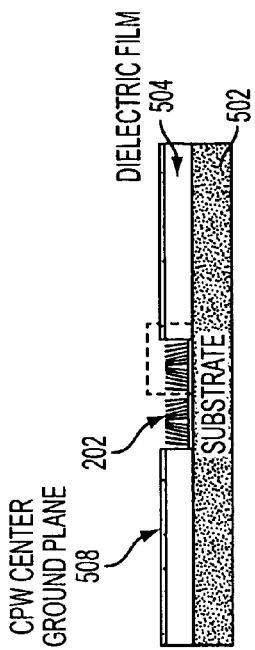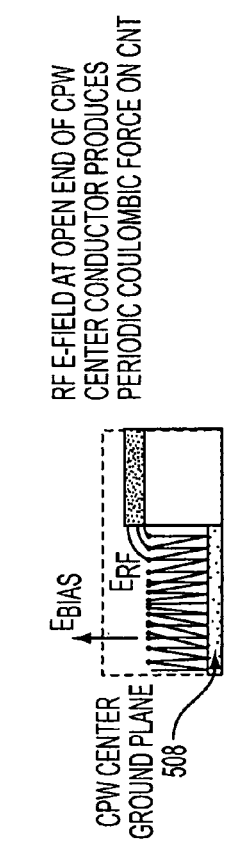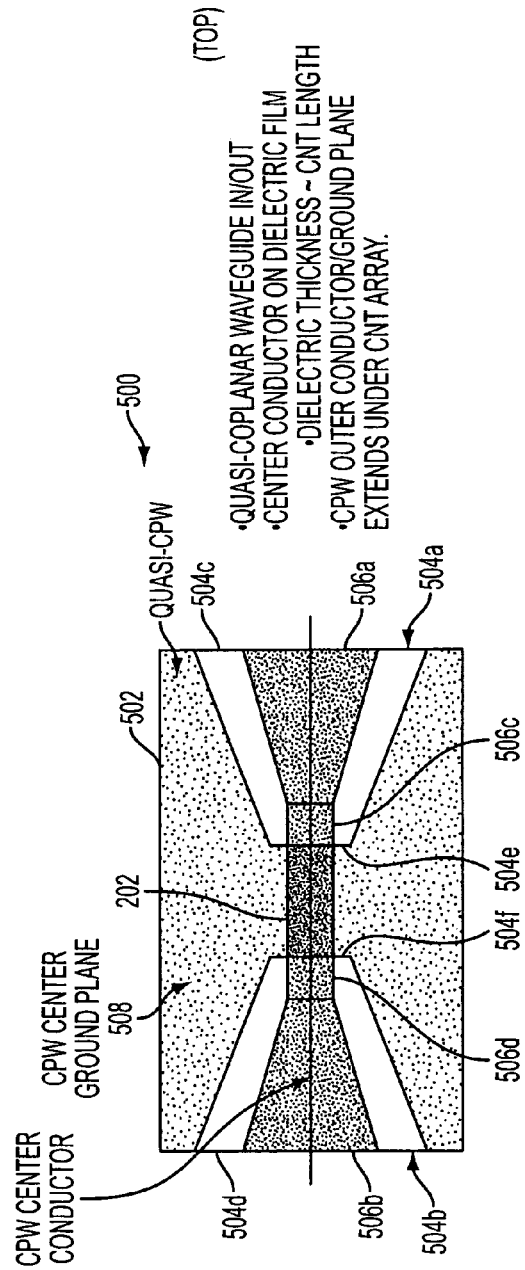

ANALOGOUS TO SURFACE ACOUSTIC WAVE EXCITATION
• TRANSDUCER STRUCTURES
• DEVICE CONCEPTS

RADIO FREQUENCY DEVICE AND METHOD USING A CARBON NANOTUBE ARRAY

GOVERNMENT LICENCE RIGHTS

This invention was made with Government support under contract no. 30011555 awarded by JPL/DARPA. The Government has certain rights in this invention.

BACKGROUND OF THE INVENTION

1. Field of the Invention

The present invention is directed to electronic devices that employ carbon nanotube arrays, and methods of making and using the same.

2. Description of the Related Art

Carbon nanotubes were discovered in the early 1990s as a product of arc-evaporation synthesis of fullerenes. Scientists have since determined that carbon nanotubes have extraordinary physical characteristics, and their potential use in many different applications has attracted much attention. However, no commercially viable electronic applications for nanotube technologies have been available until now.

As a result, there is a need to develop new and improved applications for carbon nanotube science that are commercially viable.

SUMMARY OF THE INVENTION

According to an embodiment of the present invention, a radio frequency (RF) filter is provided that includes a substrate on which a filter input and a filter output are each coupled with a carbon nanotube (CNT) array. The CNT array is disposed on a ground plane. The filter input and output comprise coplanar waveguides.

According to an embodiment of the present invention, a radio frequency (RF) filter includes a substrate, first and second dielectric layers formed on first and second portions of the substrate, a ground plane formed on a third portion of said substrate, a carbon nanotube array, and first and second signal guides. The third portion of the substrate includes, at least in part, the area between the first and second portions thereof. The carbon nanotube array is formed on a portion of said ground plane between the first and second dielectric layers. The first and second signal guides are formed on the first and second dielectric layers, such that an RF signal may be input to and output from the carbon nanotube array via the first and second signal guides.

According to another embodiment of the present invention, a resonator is provided. The resonator includes a substrate, a ground plane, a carbon nanotube array, first and second electrodes, and a magnet. The ground plane is formed on a portion of the substrate. The carbon nanotube array is formed on said ground plane. The first and second electrodes formed on the substrate as input and output to said carbon nanotube array. Each of the first and second electrodes is separated from the ground plate by a gap. The magnet generates a magnetic field parallel to the carbon nanotubes of said array.

According to another embodiment of the present invention, a radio frequency (RF) filter is provided that includes a substrate, a dielectric layer formed on the substrate, a ground plane formed on the substrate in a well in the dielectric layer, and a carbon nanotube array formed on the ground plane. First and second electrodes are formed on first and second portions of the dielectric layer and extend at least partially over the carbon nanotube array (e.g., interdigital electrodes, strip-lines, etc.); such that an RF signal may be input to and output from the carbon nanotube array via at least one of said first and second electrodes. The filter also includes a third electrode disposed over the carbon nanotube array.

According to another embodiment of the present invention, a method for filtering an RF signal is provided. The method includes steps of providing a carbon nanotube array; providing an input and output to the carbon nanotube array; voltage biasing the carbon nanotube array; providing a magnetic field parallel to carbon nanotubes of the carbon nanotube array; and providing the RF signal to the input of the carbon nanotube array.

According to another embodiment of the present invention, a method is provided for fabricating a radio frequency (RF) filter. The method includes steps of: forming a dielectric layer onto a first substrate; removing a portion of the dielectric layer; forming a first conductor layer onto the portion exposed by the removing step; forming a carbon nanotube array onto the first conductor; forming second and third conductor layers onto the dielectric layer and a signal input and output to the carbon nanotube array; bonding a second substrate to on top of the second and third conductor layers; and forming a forth conductor layer on top of the second substrate.

BRIEF DESCRIPTION OF THE DRAWINGS

Further applications and advantages of various embodiments of the present invention are discussed below with reference to the following drawing figures:

FIG. 5 is a diagram of an RF filter according to an embodiment of the present invention;

DETAILED DESCRIPTION OF THE PREFERRED EMBODIMENTS

Figure 1:
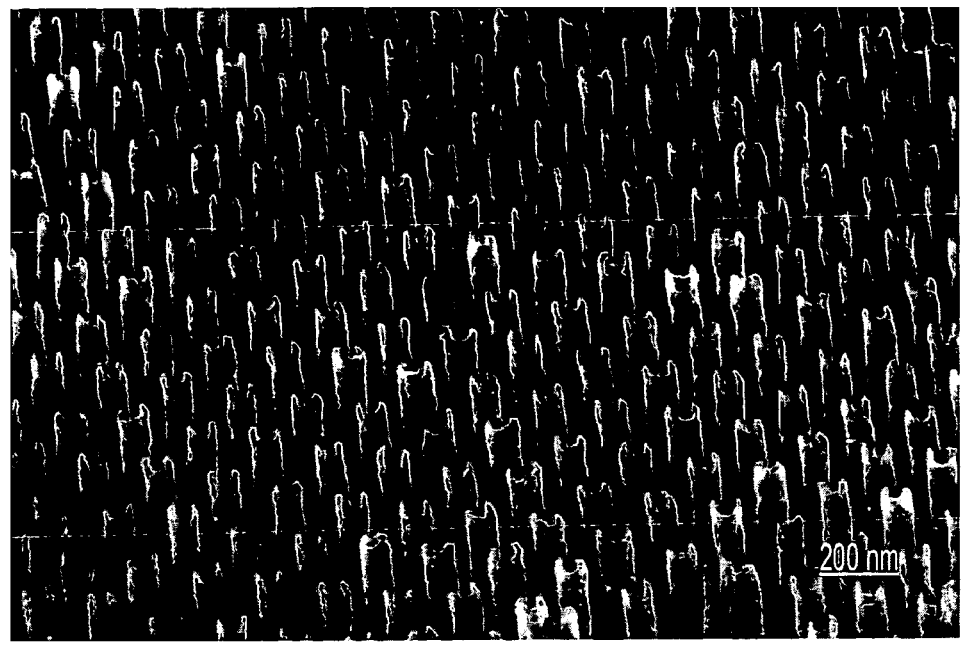
FIG. 1 is an image of a carbon nanotube array.

Arrays of highly ordered carbon nanotubes ("CNT" arrays) can be produced with tube length in the 10 nanometer to 100 micron range. Such CNT arrays can be utilized to manufacture high Q resonators and filters for the high-frequency (HF) through microwave frequency range, for a variety of applications. FIG. 1 is an image of an exemplary CNT array which was produced at Brown University and is described in J. Li, C. Papadopoulos, J. Xu, "Highly-ordered carbon nanotube arrays for electronics applications," *Appl. Phys. Lett* 75, 367 (1999), which is incorporated by reference herein.

Figure 2:
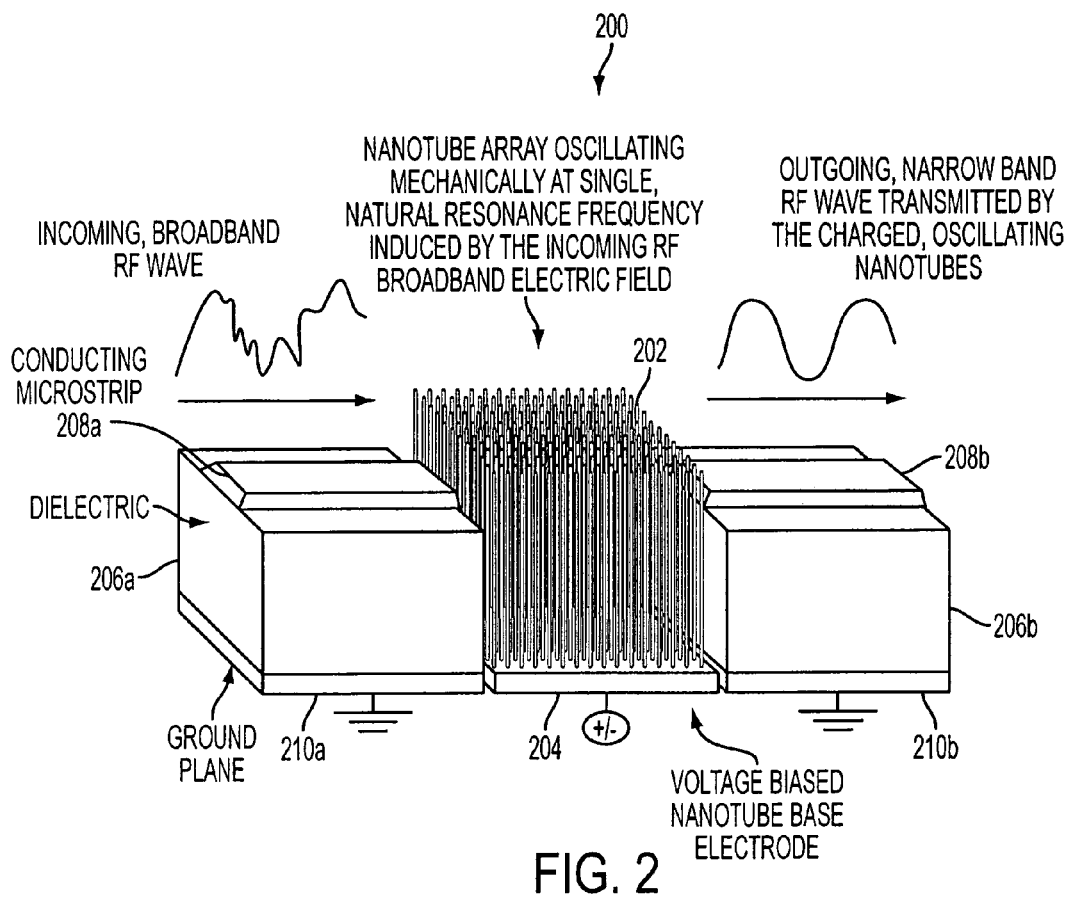
FIG. 2 is a diagram of an RF filter having a carbon nanotube array.

FIG. 2 is a diagram of a basic CNT array filter. Device 200 includes a CNT array 202 clamped onto an electrode 204 for voltage biasing the CNT array 202, and which is bound on both ends by a dielectric 206 (a,b), having a conducting strip 208 (a,b) disposed on top and a grounding plate 210 (a,b) on bottom. An RF signal can be transmitted to conducting strip 208*a* as an input to device 200, from a source (not shown) and may be for example, a broadband RF signal. The RF signal induces CNT array 202 to mechanically oscillate at a single, natural frequency. A narrow band RF signal is output by the charged, oscillating CNT array 202 to conducting strip 208*b* as the filtered output.

The fundamental resonance frequency of a single clamped CNT can be represented by:

$$f_0 = 1.875^2 (D^2 + D_i^2)^{1/2} (E_b/\rho)^{1/2} / (8\pi L^2) \quad (eq.\ 1),$$

wherein L is the length, D is the outer diameter and $D_i$ is the inner diameter, Eb is the Young's modulus, and p is the density—of the CNT. For example, a 500 nm long, single walled CNT with a diameter D of 10 nm has a resonant frequency of 213 MHz.

When an electric field is applied across the CNT array 202 (see FIG. 5), induced charges serve to provide a repulsive Coulombic force between each nanotube in the CNT array 202. The Coulombic force causes and maintains separation between high aspect ratio CNTs and provides an energy coupling mechanism between adjacent CNTs, which allows the CNTs to propagate RF waves.

A single nanotube with a charge q (induced upon its tip) in an oscillating electric field $E_{ox} \cos(\omega t)$ in the horizontal (x) direction (created by the two RF electrodes and assuming that the RF field does not modulate the amount of induced charge present) will experience a lateral (x) force:

$$F_{RF} = q\, E_{ox} \cos(\omega t).$$

There will also be an attractive DC force in the vertical (z) direction due to the induced charge (e.g., by a third electrode):

$$P_{zo} = q\, E_{oz}$$

This attractive force will stiffen the nanotube, which will permit tuning of the resonant frequency. The spring constant $k_{FP}$ is modeled as a simple cantilever beam of length L which is point loaded at the top, with fixed bottom end condition and free at the top [see, W. C. Young, *Rourk's Formulas for Stress & Strain*, $6^{th}$ ed. (McGraw-Hill, N.Y. 1975) p176 case 1*a*, which is incorporated herein by reference].

$$k_{FP} = \frac{K_1 P}{\left(\frac{C_2 C_{a3}}{C_1} C_{a4}\right)}$$

Where $$K_1 = \sqrt{\frac{P}{\hat{E}I}}$$

$$C_1 = \cosh(K_1 L)$$

-continued $$C_2 = \sinh(K_1 L)$$

$$C_{a3} = \cosh(K_1 L) - 1$$

$$C_{a4} = \sinh(K_1 L) - K_1 L$$

$C_1 = \cosh(K_1 L)$
$C_2 = \sinh(K_1 L)$
$C_{a3} = \cosh(K_1 L) - 1$
$C_{a4} = \sinh(K_1 L) - K_1 L$ Here $\hat{E}$ is Young's modulus and I is the moment of inertia for the nanotube, which is taken to have an outer radius $R_o$ and inner radius $R_i$.

$$I = \frac{\pi}{4}(R_0^4 - R_i^4)$$

The tube is also assumed to have a mass M found using the density ρ (taken to be that of graphite for carbon nanotubes):

$$M = \rho L \pi (R_o^2 - R_i^2)$$

The one-dimensional equation of motion for this system is Newton's law for a simple harmonic oscillator with a quality factor Q and a resonant frequency $\omega_R$:

$$F = M\alpha = F_{spring} + F_{damping} + F_{electric}$$

$$M\frac{d^2 x}{dt^2} = -k_{FP} x - M\frac{\omega_R}{Q}\frac{dx}{dt} + qE_{ox}\cos(\omega t)$$

Such an oscillator has an amplitude A at the frequency ω given by the well known equation [see, J. W. M. Chon, P. Mulvaney, and J. E. Sader, "Experimental validation of theoretical models for the frequency response of atomic force microscope cantilever beam immersed in fluids," *J. Appl. Phys.*, 87(8) 3978–3988 (2000), which is incorporated herein by reference]:

$$A(\omega) = \frac{A_0 \omega_R^2}{\sqrt{(\omega^2 - \omega_R^2)^2 + \frac{\omega^2 \omega_R^2}{Q^2}}}$$

Where $A_0$ is the static deflection of the cantilever spring: $A_0 = -q\, E_{ox}/k_{FP}$.

For an array of nanotubes (also referred to as the "wheat-field") arranged in a square grid and further assuming that only nearest-neighbor Coulombic interactions are significant, then Pesetski [see, Aaron Pesetski, personal communication, which is incorporated herein by reference] has shown that that longitudinal and transverse dispersion waves will propagate across the array according to:

$$\omega_{longitudinal} = \sqrt{\frac{k_{FP}}{M} + \frac{q^2}{\pi \varepsilon_0 M d^3}[1 - \cos(sd)]}$$

$$\omega_{transvere} = \sqrt{\frac{k_{FP}}{M} + \frac{q^2}{2\pi\varepsilon_0 M d^3}[1 - \cos(sd)]}$$

Where s is the wavenumber (usually given in units of cm$^{-1}$) and d is the at rest separation distance between the nanotubes. The maximum wavenumber occurs for $s_{mac} = \pi/d$.

The group velocity for dispersion waves is found by taking the derivative with respect to s, yielding:

$$V_{longitudinal} = \frac{q^2 \sin(sd)}{2\pi\varepsilon_0 M d^2 \sqrt{\frac{k_{FP}}{M} + \frac{q^2}{\pi\varepsilon_0 M d^3}[1 - \cos(sd)]}}$$

$$V_{transvere} = \frac{-q^2 \sin(sd)}{4\pi\varepsilon_0 M d^2 \sqrt{\frac{k_{FP}}{M} + \frac{q^2}{2\pi\varepsilon_0 M d^3}[1 - \cos(sd)]}}$$

The energy density J' [J/m] in the array is found by calculating the work in each in individual Nanotube which has been modeled here as a linear spring, and dividing it by the at rest separation distance in the wheat field.

$$J' = \frac{\frac{1}{2}k_{FP}A^2}{d}$$

The power transmitted per nanotube is the product of the energy density and the group velocity.

$$W_{longitudinal} = J'V_{longitudinal}$$

$$W_{transvere} = J'V_{transvere}$$

Figure 3:
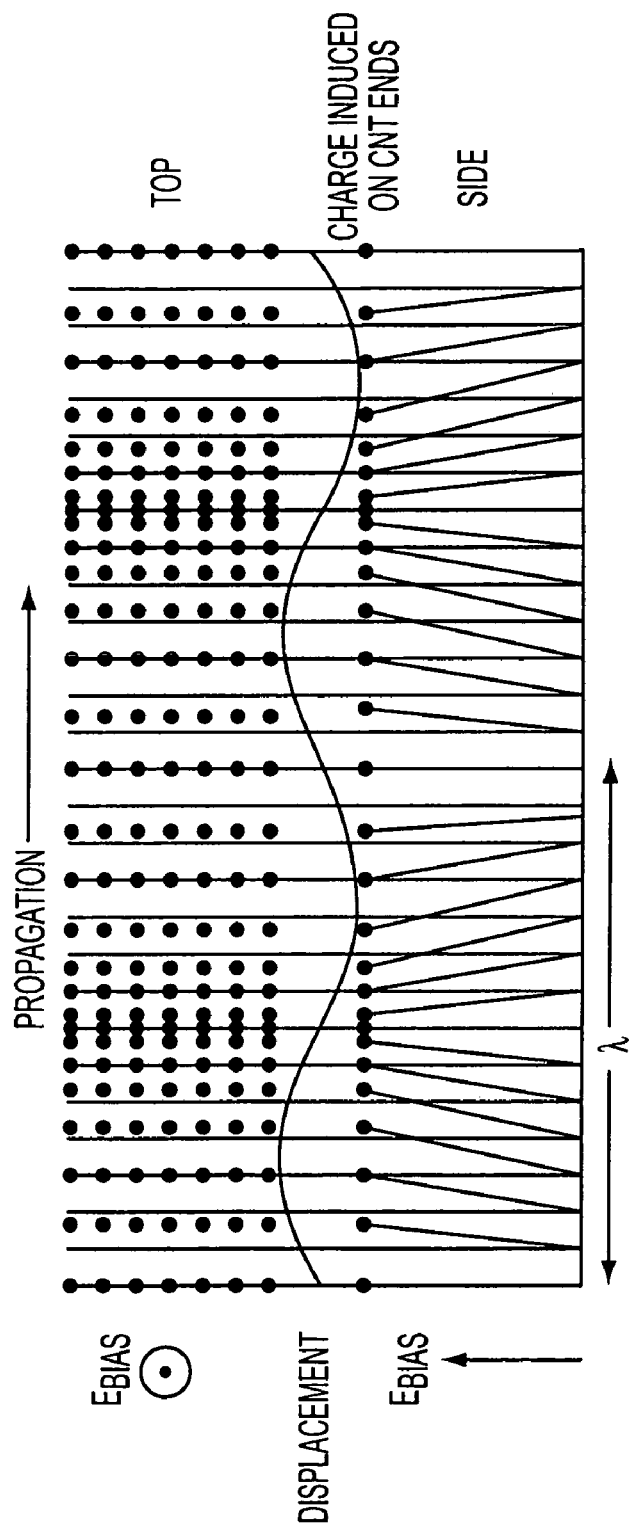
FIG. 3 illustrates longitudinal propagation of a radio wave through a carbon nanotube array.

FIG. 3 illustrates longitudinal wave propagation in a CNT array according to the present invention. CNT array 202 may be voltage biased with an electrode (see e.g., electrode 808 FIG. 8) disposed over the top of the array. As shown, Coulomb forces due to induced charges on the CNT ends stiffen each CNT and provide coupling to adjacent CNTs. The spacing between the CNTs should be adequate to prevent physical contact between the CNTs, but close enough so that they electrically interact with each other. It should be noted that the CNT array is shown here as a square array, rather than the hexagonal array of FIG. 1. However, this is for illustrative purposes only and is not intended to limit the invention.

Propagation in the CNT array is possible at frequencies close to the single CNT resonance frequency $f_0$. The coulombic force can be expressed as:

$$F_{coul} = q_1 q_2/(4\mathcal{E}d^2) \quad \text{(eq. 2)}$$

where $q_1$ and $q_2$ are the charges on adjacent CNTs and d is the separation between CNTs. The Coulomb force stiffens the CNT resulting in an increase in resonance frequency and will result in electric field tuning of the wave propagation, as shown in FIG. 3.

Figure 4:
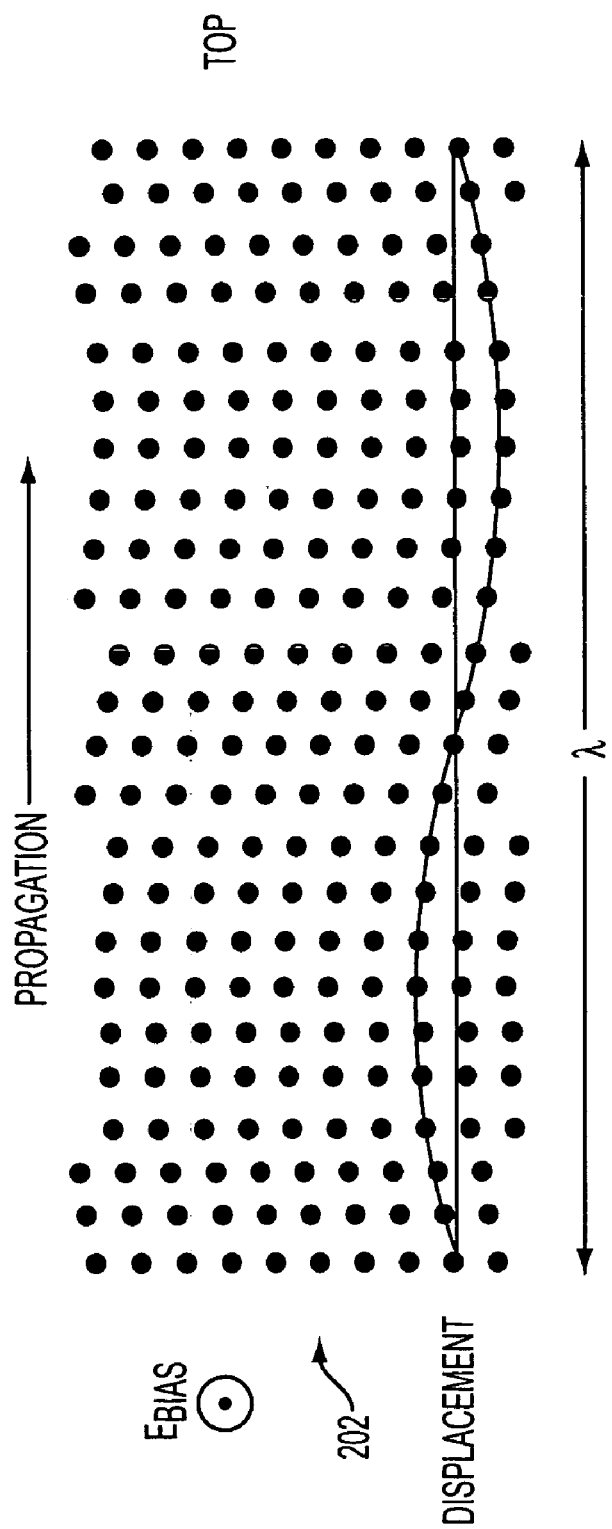
FIG. 4 illustrates shear wave propagation in a carbon nanotube array.

FIG. 4 illustrates shear wave propagation in a CNT array 202. Here, the direction of displacement is transverse to the direction of the propagation. Longitudinal and shear waves are special cases and, in general, propagation is possible at any angle to the displacement directions, depending upon the transducer configuration.

FIG. 5 is a diagram of an RF filter having a CNT array according to an embodiment of the present invention. The device 500 includes a CNT array 202 on a substrate 502, bound on two sides by a dielectric layer 504 (a,b) also disposed on the substrate 502. In this embodiment, the substrate and dielectric layer may comprise any suitable material and are preferably comprised of sapphire and aluminum oxide (alumina), respectively. Alternatively, quartz may be used as a substrate with a silicon oxide layer as the dielectric.

As shown in the top view, the dielectric layer 504 (a,b) is trapezoidal in shape, having a widest side being at the distal end 504 (c, d) from the CNT array 202, and the narrowest side 504 (e, f) being adjacent to the CNT array 202. A conducting strip or electrode 506 (a, b) is disposed on each dielectric layer 504 (a,b) for providing the input signal and outputting the output signal from the RF filter 500. Each conductor strip 506 (a,b) may be the same shape as the dielectric 504 (a,b) on which it is disposed—i.e., the perimeter of the conductor strip being a constant distance from the perimeter of the dielectric—except for an extension 506 (c,d) that is equal in width to the width of the CNT array 202 and extends from the narrow end 504 (e, f) of each dielectric layer to the point where the sides of each conductor strip 506 (a,b) begin to widen.

The CNT array 202 is formed on a ground plane 508, deposited on substrate 502. The ground plane 508 covers the exposed portion of the substrate and, together with the stripline 506, forms a quasi-coplanar waveguide (CPW)—the ground plane and the conducting plane being separated merely by the height of the CNT array—which enhances coupling to the CNTs and input-to-output isolation. The conducting strips 506 may be formed from a suitable conducting material, preferably gold.

The array should be DC biased, such as by a third electrode (see, e.g., electrode 808 FIG. 8) spaced from the array such that the electric field caused by the third electrode does not perturb the electric field between the first two electrodes, yet close enough to bias the individual CNTs.

Figure 6B:
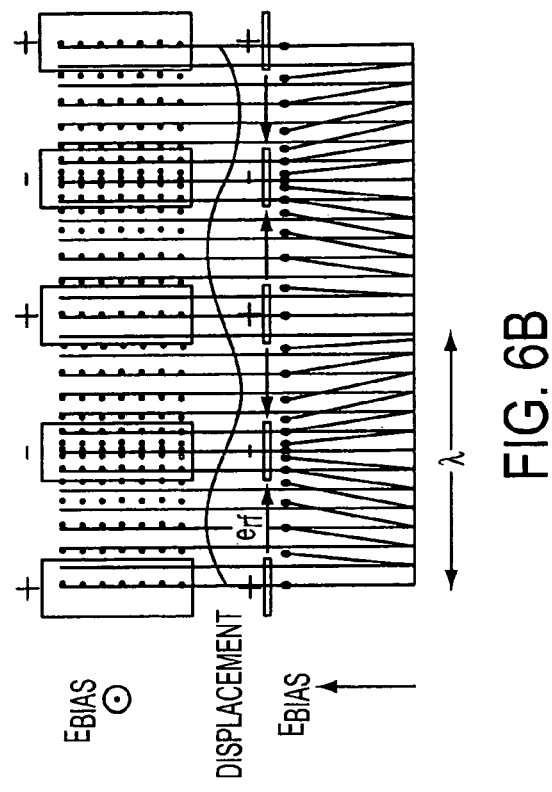
FIGS. 6A–6E are diagrams of an RF filter including interdigital electrodes according to an embodiment of the present invention.

According to another embodiment of the present invention, interdigital electrodes can be added to the device to enhance the performance of the device. Transduction of waves is generated in the CNT array 202 through the use of the interdigital electrodes in addition to or as an alternative to the wave guides of the previous embodiment. Referring to FIGS. 6A and 6E, interdigital electrodes 602 (a,b) are formed over the top of the CNT array 202 in a comb-tooth shape, having teeth 604 extending over the top of the CNT array 202 without connecting, being separated by air gaps 606.

The teeth 604 need to be close to the top of the array 202 and could be fabricated by using two separate chips and then flipping one chip and bonding it to the other (e.g., see FIG. 10 and discussion below). Again, a third electrode (not shown) is preferably disposed above the CNT array 202 to DC bias each nanotube. The electrode is preferably a distance from the top of the CNT array 202 approximately ten times the distance between each tooth of the interdigital electrodes.

Figure 6A:
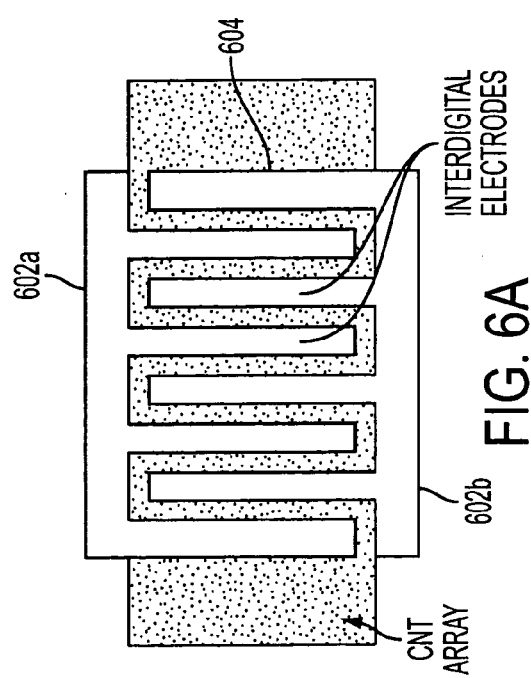
Figure 6C:
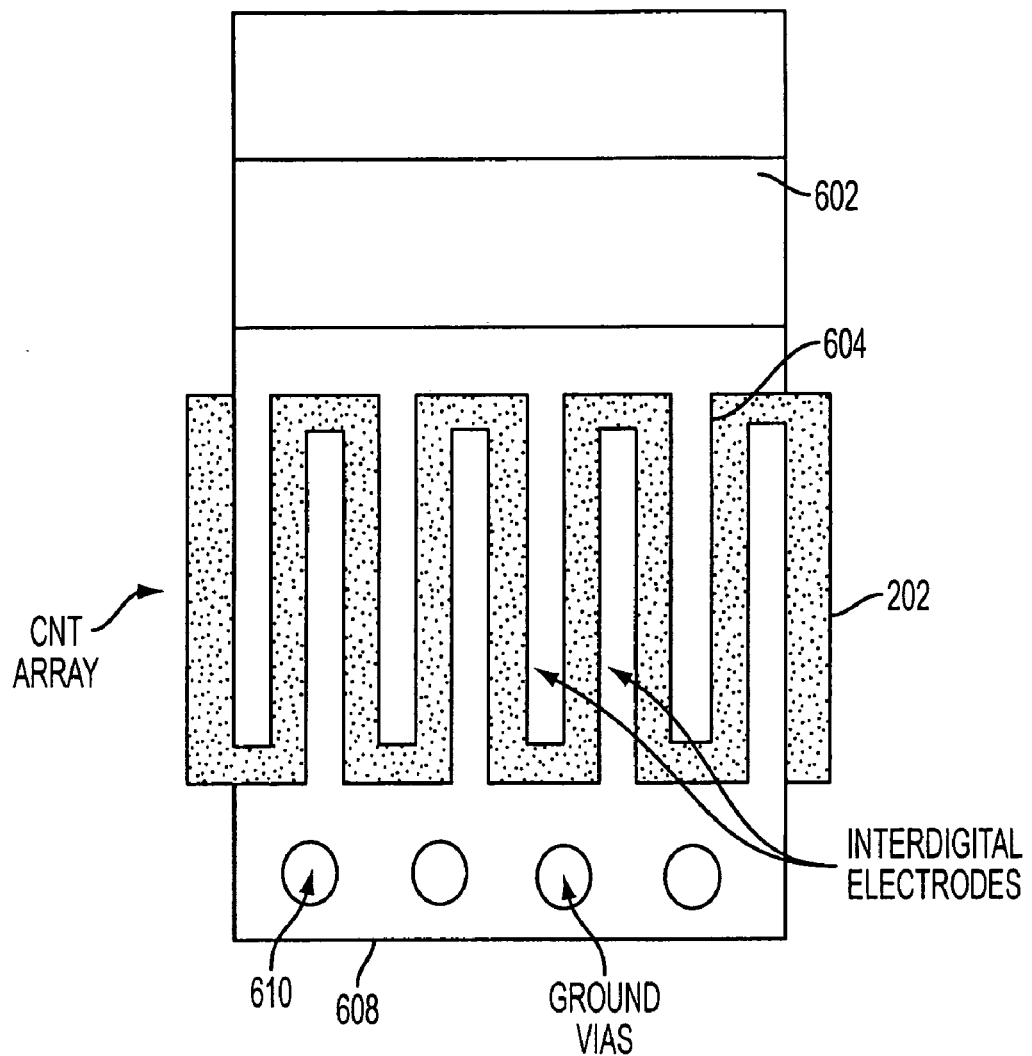
Figure 6D:
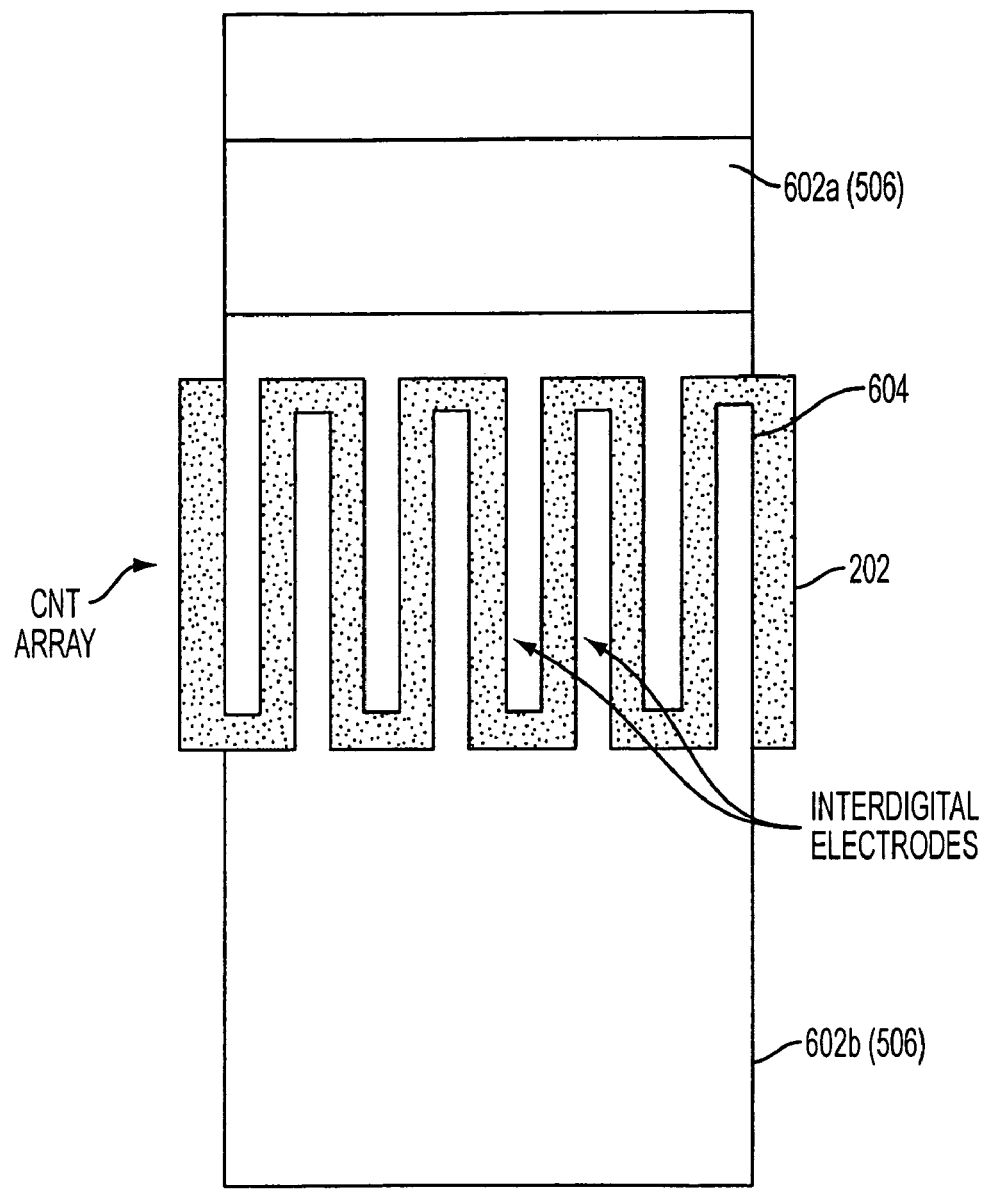
Figure 6E:
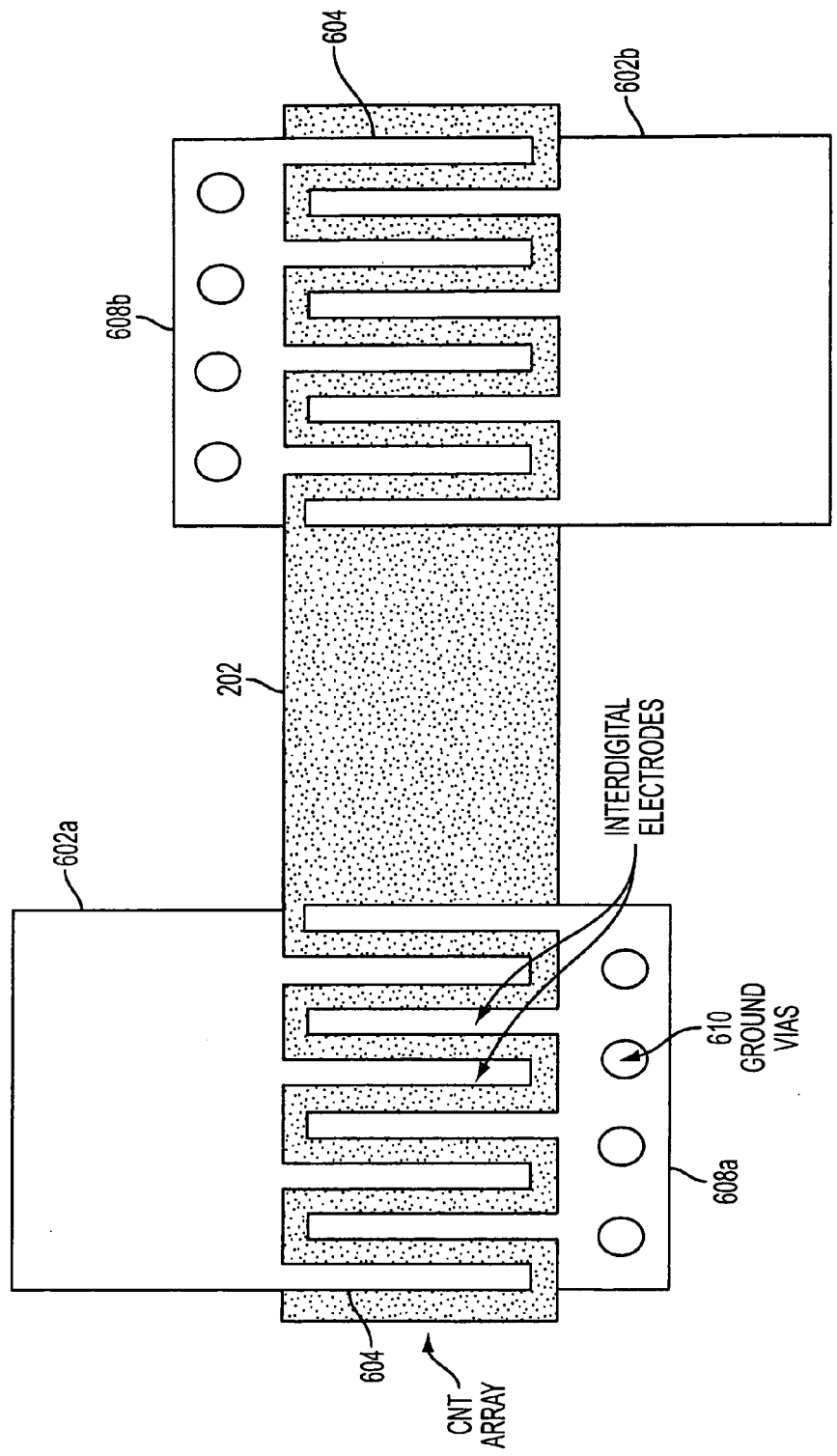

FIG. 6D is an expanded view of FIG. 6A.

FIG. 6B illustrates the behavior of the CNTs between each tooth 604 of the interdigital during propagation of a wave from one interdigital electrode to another. As shown in FIG. 6B, the teeth 604 are disposed over top of the CNTs, but preferably close to tips of the CNTs. To select the number of teeth 604 for each electrode 602 and the distance 606 between teeth 604, analogies can be drawn to surface acoustic wave technology. If a small number of teeth are used, a broadband filter is created, and if a large number of teeth are used, a narrow band device is created. The number of teeth is set according to the bandwidth range for which the device is intended.

Referring to FIG. 6C, a single interdigital electrode feed port configuration is shown. Electrode (port) 602 and a ground electrode 608 are disposed on opposite sides of the CNT array 202, having teeth 604 projecting over the array 202, each separated by a gap 606. Ground electrode 608 is grounded by ground vias 610. In this embodiment, the input signal will excite the CNTs and creates a change in the reflected power, and therefore, could be used as a resonator or oscillator.

Referring to FIG. 6E, a pair of interdigital electrode feed ports are coupled with a common CNT array 202. Again, coupling from the interdigital electrodes to the CNT wave is used to transmit the signal from the first port 602a to the array, to the second port 602b. Electrodes 602a and a ground electrode 608a are disposed on opposite sides of the CNT array 202 at a first portion of the CNT array 202, while similarly, electrode 602b and ground electrode 608b are disposed on opposite sides of the CNT array 202 at another portion of the CNT array 202. Each electrode has teeth 604 projecting over the array 202, each separated by a gap 606. Ground electrodes 608(a,b) are grounded with ground vias 610.

As shown, the CNT array 202 is common to both pairs of electrodes. In this embodiment, port 1 and port 2 operate as inputs/outputs to the device. With respect to the teeth, each tooth is designed to have several nanotubes there under. For example, it has been discovered that one micron wide teeth work well with standard CNT sizes. One skilled in the art will understand that analogies can be drawn from surface acoustic wave technologies. As such, one will understand the different advantages to size and spacing of the electrode teeth. The teeth should be wide enough so that their series resistance does not ostensibly attenuate the RF signal and yet narrow enough so that there is a region where the electric field applies to the field of nanotubes.

The center to center spacing of adjacent fingers can be set by the formula, $2\pi/\lambda$, wherein $\lambda$ is wavelength of the CNT wave launched in the nanotube array by the RF signal. Spacing from the top of the nanotubes should be kept as small as possible. Of course, there is a need for finite spacing to work with.

An optional magnetic field (see FIG. 8) may be added to the device, as will be explained in further detail below. In a preferred embodiment, the device is fabricated with the following specifications:

Separation from tip of CNT to electrode teeth=0.01–0.1 microns;
Separation from tip of CNT to 3$^{rd}$ Electrode=1–10 microns;
Thickness of teeth=0.05–1 microns;
Tooth width=0.1–1.0 microns;
Tooth separation=0.1–1.0 microns;
Tooth length=10–100 microns;
Number of teeth=2–1000 teeth;
For two ports, transducer separation=0.5–100 microns;
Voltage on 3$^{rd}$ Electrode=0–100 Volts negative relative to tip (positive will also work but is below threshold for field emission);
RF Signal Amplitude=0–10 Volts;
Nanotube Length=0.01–1 microns;
Nanotube Separation=0.01–1 microns;
Optional Magnetic Field=0–1 Tesla.

Figure 7A:
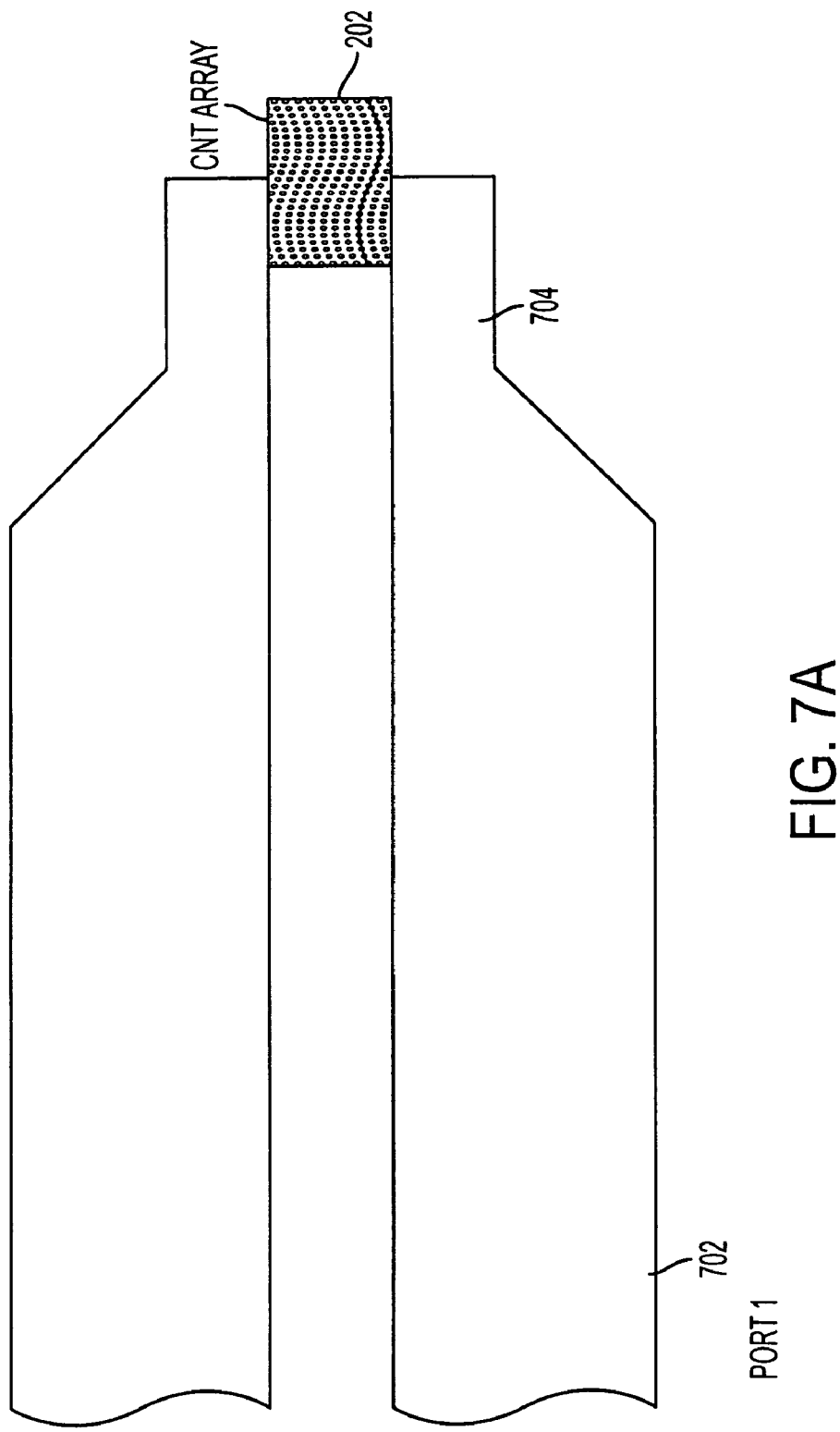
FIGS. 7A–7C are diagrams of an RF filter according to another embodiment of the present invention and of shear wave transduction of longitudinal waves therein, respectively.
Figure 7B:
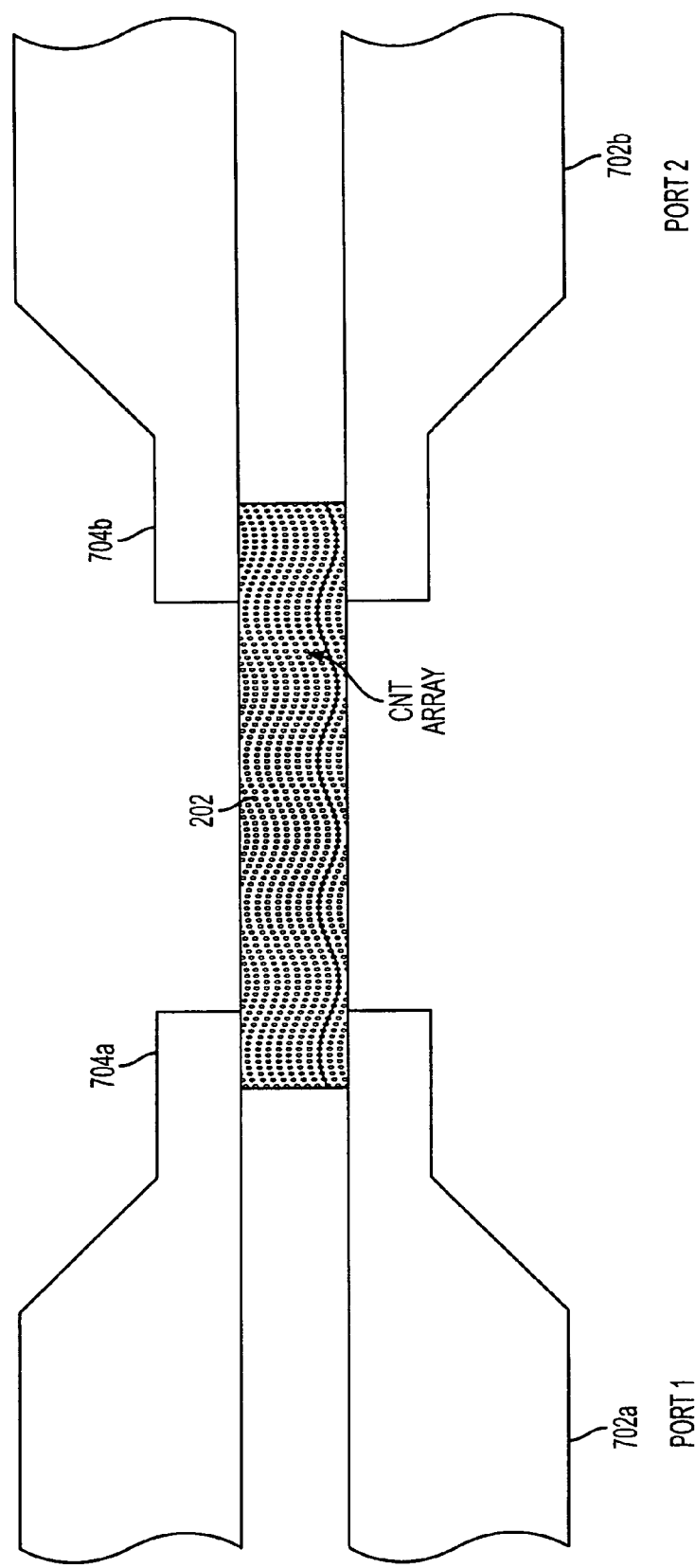
Figure 7C:
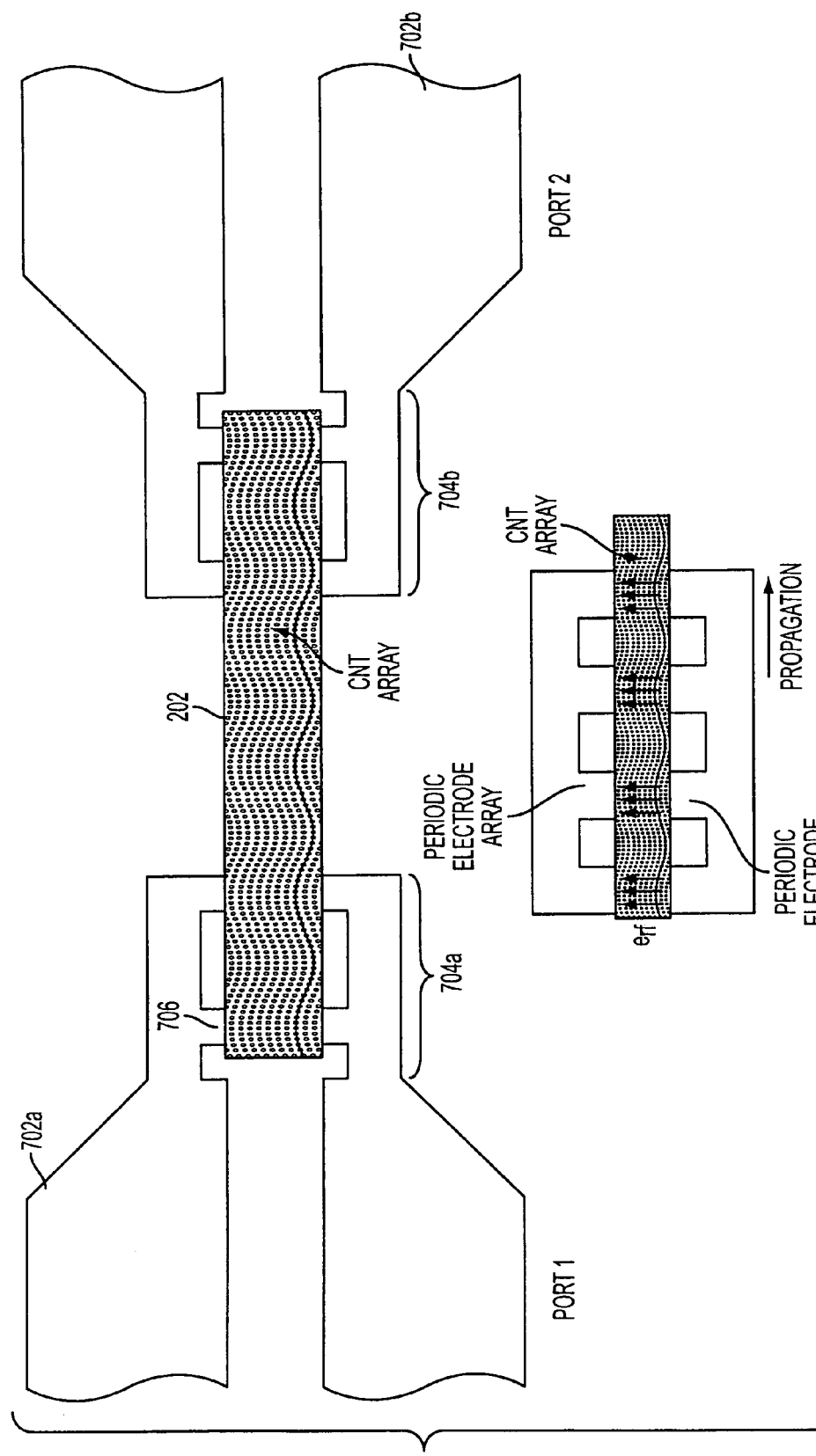

According to another embodiment of the present invention, shear wave transduction is generated in the CNT array 202 by using slot line approaches as shown in FIGS. 7A–C, and includes single port (7A), two-port (7B) and periodic approaches (7C). In-plane electric fields are readily obtained with a slot-line RF feed 702. The periodic transducer shown in FIG. 7C uses unidirectional e-fields since alternating fields tend to cancel and provide a strong component in the direction of propagation. In some cases, the alternating arrangement may be desirable to excite a composite longitudinal/shear wave and the transducer arrangement to do this may be easily obtained from FIG. 7C.

In both the single and multiple slot slot-line waveguides, the wave guides are formed on the dielectric layer as shown in FIG. 5, but protrude over the CNT array 202 without touching one another, i.e, there is air gap between the wave guides. As shown in FIG. 7C, teeth 706 can be spaced to periodically excite the shear waves, similar to the embodiments of FIGS. 6A–E. The slot-line electrodes can be formed by conventional means, such as by using a photoresist and mask to form the metal layers onto the carbon nanotube array. It has been discovered that the carbon nanotubes are stiff and strong enough to be unaffected by the process of forming the interdigital electrodes. That is, covering the CNT array with a photo resist and later removing the photoresist does not damage the individual CNTs.

Figure 8:
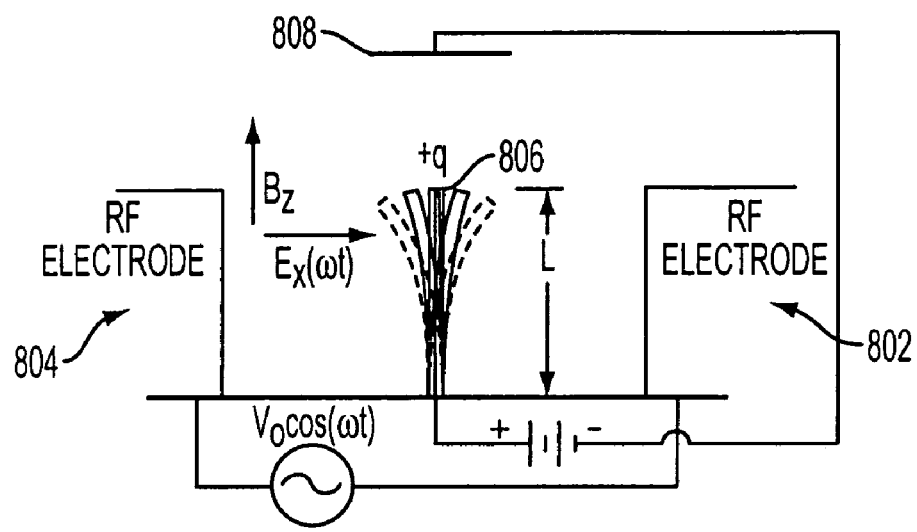
FIG. 8 is a diagram of a single nanotube resonator according to an embodiment of the present invention.

Referring to FIG. 8, according to another embodiment of the present invention, a microwave resonator is shown. Two RF electrodes 802, 804 are disposed on opposite sides of the CNT array 806 (202 of FIG. 2). Only one tube 806 of the CNT array is drawn for clarity. In the case where a dielectric substrate is used, a gap must be left between the RF electrodes 802, 804 and the ground plane on which the CNT array is formed.

A third, DC bias electrode 808 is used to induce a charge Q+ upon the tip(s) of the CNT(s). When a magnetic field $B_z$ is added in the z-direction, an oscillating RF electric field $V_0 \cos(wt)$ in the x-direction interacts with the electric charge at the tip of the CNT(s), causing a force to move the CNT(s) back and forth in the y-direction.

In the presence of a magnetic field $B_z$ aligned parallel with the axis of the nanotubes, Newton's law can be written for two dimensions (assuming plane motion) taking into account the Lorentz force qv×B. In the equations below, it is also taken that the oscillating RF field only exists in the x-direction:

$$F = Ma = F_{spring} + F_{damping} + F_{electric} + F_{Lorentz}$$

$$M\frac{d^2x}{dt^2} = -k_{FP}x - M\frac{\omega_R}{Q}\frac{dx}{dt} + qE_{ox}\cos(\omega t) + q\frac{dy}{dt}B_z$$

$$M\frac{d^2y}{dt^2} = -k_{FP}y - M\frac{\omega_R}{Q}\frac{dy}{dt} + 0 - q\frac{dx}{dt}B_z$$

The tip motion is predicted to be an ellipse orbiting in a direction determined by whether the magnetic field is parallel or anti-parallel to the nanotube's axis.

Figure 9:
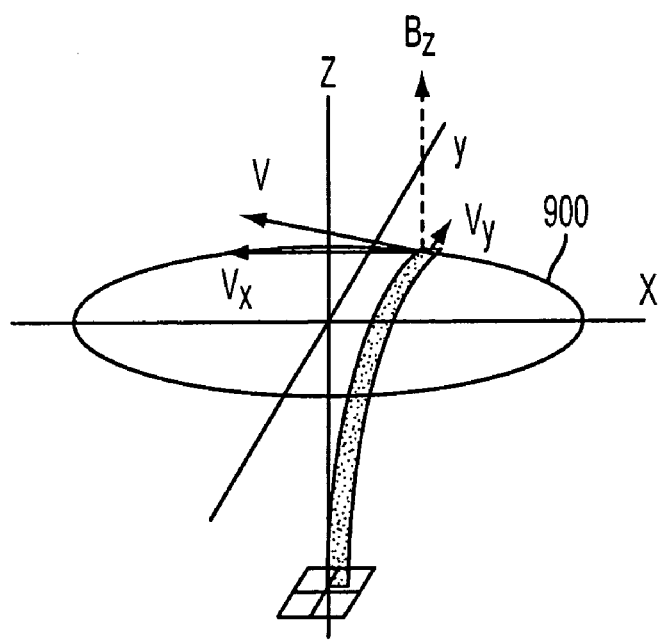
FIG. 9 illustrates cantilever orbiting in a single nanotube resonator.

FIG. 9 shows the interaction of the magnetic field added in the z-direction. The moving charge interacts with the magnetic field creating a Lorentz force which acts orthogonally ($\vec{F}_{magnetic} = q\vec{v} \times \vec{B}$). An elliptical orbital motion 900 results, with the tip of the CNT rotating around the tether formed by the nanotube 806. This orbital effect is well known in such devices as mass spectrometers and ion traps.

Here, however, rather than separating out a particular mass or to trap a particle, a highly reliable, tunable resonator is created.

Furthermore, since the rotation of the CNT will be clockwise or counter-clockwise depending upon the polarity of the applied magnetic field, the device is a passive non-reciprocal RF device, meaning that looking in (electrically speaking) port one is different than looking in port 2. Such non-reciprocal devices have unique RF characteristics which can be exploited for important components such as isolators and circulators.

The magnetic field may be added to the embodiments described above as well, in order to tune the devices. The magnetic field changes the natural resonant frequency of the carbon nanotube, shifting it away from the zero magnetic field state. The magnetic field may be added by conventional means, for example, preferably by an accurate adjustable magnet. The RF devices may be tuned by either adjusting the DC bias of the CNT array 202 or by adjusting the optional magnetic field.

A method of fabricating the RF devices of the present invention is illustrated in FIGS. 10A–D. First, a thin film dielectric 504 is deposited upon a substrate. The dielectric and substrate both preferably comprise materials having a low loss tangent, such as sapphire, silicon dioxide or alumina, and may be the same material. One skilled in the art will understand that using a dielectric layer of a different material than that of the substrate will simplify the fabrication process.

Next, the thin film dielectric layer is patterned and etched to create a well for the CNT array. For example, hydrofluoric acid may used to etch the well.

A metallic ground plane 508 is deposited inside the well. On top of the ground plane, the carbon nanotube array 202 is grown.

Next, the electrodes 506 (conductor) may be deposited, e.g., evaporated Ti/Au. The electrodes are then patterned. A sacrificial layer 1002 (e.g., polysilicon) is deposited upon the entire substrate for the purpose of making the tips of the CNTs in the same plane as the electrode. CMP (Chemical-Mechanical Polish) is used to create a flat surface with nanotube tips in the same plane as the electrodes. The sacrificial layer is then removed, e.g. etch poly-silicon away with XeF2.

As an alternative, the sacrificial layer step may be performed before adding the electrodes, so that the tips of CNTs are aligned in the plane immediately below the electrodes.

For embodiments having interdigital electrodes or strip-lines protruding over the CNT array 202, the electrodes are formed upon another substrate. This substrate is a low $\varepsilon_r$ material and acts as the electrode carrier.

Figure 10A:
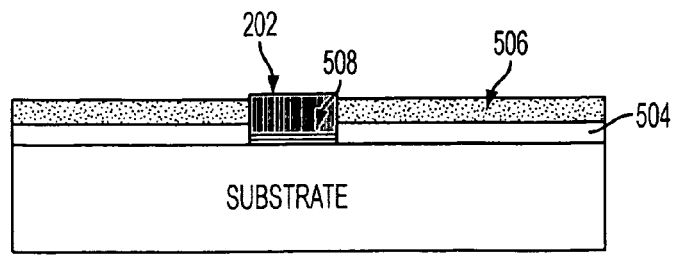
FIGS. 10A–D illustrate a method for fabricating an RF filter having a carbon nanotube array according to an embodiment of the present invention.
Figure 10B:
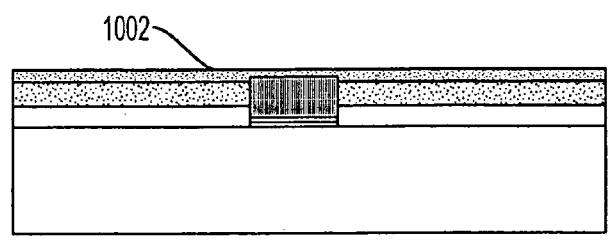
Figure 10C:
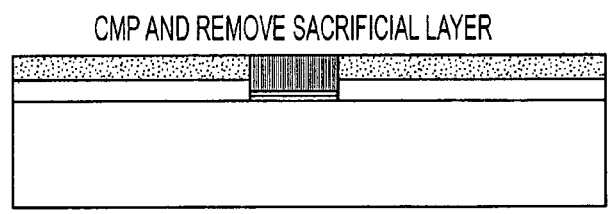
Figure 10D:
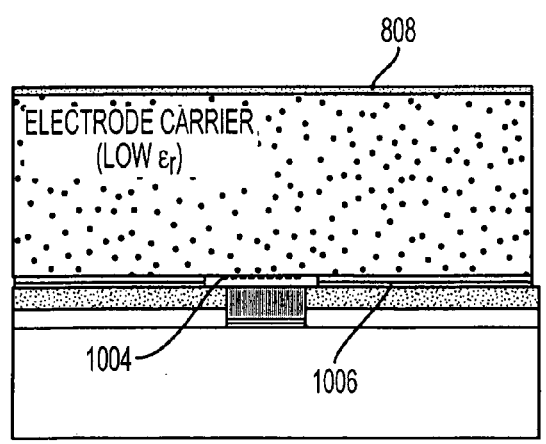

A metallic thin film is deposited on the electrode carrier and patterned into interdigital electrode fingers (teeth) or strip-line. A spacer layer is deposited and patterned. This substrate is flipped and bonded onto the first substrate such that, as shown in FIG. 10D, the electrode 1004 is overtop the CNT array 202 as desired and coupled with the electrodes 506.

The electrode carrier can be reduced to the appropriate size by grinding or etching the lid. The third electrode 808 is then deposited upon the electrode carrier. Vias may be cut into the electrode carrier to gain access to buried electrodes.

Thus, a number of preferred embodiments have been fully described above with reference to the drawing figures. Although the invention has been described based upon these preferred embodiments, it would be apparent to those of skill in the art that certain modifications, variations, and alternative constructions would be apparent, while remaining within the spirit and scope of the invention.

We claim:

1. A radio frequency (RF) filter, comprising:
   a substrate;
   a dielectric layer formed on first and second portions of said substrate;
   a ground plane formed on a third portion of said substrate, said third portion being at least, in part, between said first and second portions;
   a carbon nanotube array being formed on a portion of said ground plane between said first and second dielectric layers; and
   first and second signal guides formed on the first and second dielectric layers, such that an RF signal may be input to and output from said carbon nanotube array via said first and second signal guides.

2. The filter as recited in claim 1, wherein first and second portions of said dielectric layer are adjacent to first and second sides of said carbon nanotube array, respectively.

3. The filter as recited in claim 2, wherein said first and second signal guides are adjacent to said first and second sides of said carbon nanotube array, respectively.

4. The filter as recited in claim 1, wherein said first and second signal guides comprise a highly conductive material.

5. The filter as recited in claim 1, wherein first and second signal guides have substantially a same perimeter shape as said first and second dielectric layers.

6. The filter as recited in claim 1, wherein said first and second dielectric layers have a trapezoidal shape, each having a narrow side adjacent to a side of said carbon nanotube array.

7. The filter as recited in claim 6, wherein said first and second dielectric layers have a same thickness as a height of said carbon nanotube array.

8. The filter as recited in claim 7, wherein said first and second signal guides and said ground plane form a co-planar wave guide.

9. The filter as recited in claim 1, wherein said first and second signal guides and said ground plane form a co-planar wave guide.

10. The filter as recited in claim 1, wherein said substrate comprises silicon and said first and second dielectric layers comprise aluminum oxide.

11. The filter as recited in claim 1, wherein said first and second dielectric layers have a same thickness as a height of said carbon nanotube array.

12. The filter as recited in claim 11, wherein said first and second signal guides and said ground plane form a co-planar wave guide.

13. The filter as recited in claim 12, wherein said first and second dielectric layers have a trapezoidal shape, each having a narrow side adjacent to a side of said carbon nanotube array.

14. The filter as recited in claim 13, wherein first and second signal guides have substantially a same perimeter shape as said first and second dielectric layers.

15. The filter as recited in claim 14, wherein said first and second signal guides have first and second sides that are adjacent to said first and second sides of said carbon nanotube array.

16. The filter as recited in claim 15, wherein said first and second sides of said first and second signal guides have a same width as the width of said carbon nanotube array.

17. The filter as recited in claim 16, wherein said first and second signal guides comprise a highly conductive material.

18. The filter as recited in claim 17, wherein said first and second signal guides comprise gold.

19. The filter as recited in claim 1, further comprising first and second electrodes being formed over said carbon nanotube array, said first and second electrodes being separated by carbon nanotubes and are coupled with said first and second signal guides respectively.

20. The filter as recited in claim 19, wherein said first and second electrodes have a comb-tooth shape and teeth of said first electrode are formed between teeth of said second electrode.

21. The filter as recited in claim 20, wherein said first and second signal guides comprise strip-line type feeds.

22. The filter as recited in claim 1, wherein said first and second signal guides comprise slot-line type signal guides, having at least a single slot formed over said carbon nanotube array.

23. The filter as recited in claim 22, where said first and second signal guides have a plurality of slots formed over said carbon nanotube array.

24. The filter as recited in claim 1, further comprising an electrode disposed above said carbon nanotube array, separated from said array by an air gap, said electrode being DC biased.

25. The filter as recited in claim 24, further comprising a means for providing a magnetic field to said carbon nanotube array.

26. The filter as recited in claim 24, wherein said magnetic field is applied in a direction parallel to a length of each nanotube of said array.

27. A resonator, comprising:
a substrate;
a ground plane formed on a portion of said substrate;
a carbon nanotube array being formed on said ground plane;
first and second electrodes formed on said substrate as input and output to said carbon nanotube array, each of said first and second electrodes being separated from said ground plane by a gap; and
a magnet which generates a magnetic field parallel to the carbon nanotubes of said array.

28. The resonator as recited in claim 27, wherein said first and second electrodes are formed on opposite sides of said carbon nanotube array.

29. The resonator as recited in claim 27, wherein said substrate comprises a dielectric material.

30. The resonator as recited in claim 29, wherein said dielectric material comprises sapphire.

31. The resonator as recited in claim 27, wherein said first and second electrodes comprise a conductive material.

32. The resonator as recited in claim 31, wherein said first and second electrodes comprise gold.

33. The resonator as recited in claim 27, further comprising an electrode disposed above said carbon nanotube array, separated from said array by an air gap, said electrode being DC biased.

34. A radio frequency (RF) filter, comprising:
a substrate;
a dielectric layer formed on the substrate;
a ground plane formed on said substrate in a well in said dielectric layer;
a carbon nanotube array formed on said ground plane;
first and second electrodes formed on first and second portions of said dielectric layer and extending at least partially over said carbon nanotube array, such that an RF signal may be input to and output from said carbon nanotube array via at least one of said first and second electrodes; and
a third electrode disposed over said carbon nanotube array.

35. The RF filter as recited in claim 34, wherein said third electrode is provided with a DC voltage.

36. The RF filter as recited in claim 34, further comprising a magnet providing a magnetic field in a direction parallel to the carbon nanotubes of said carbon nanotube array.

37. The RF filter as recited in claim 34, wherein said first and second electrodes act as first and second ports.

38. The RF filter as recited in claim 34, further including forth fourth and fifth electrodes, and wherein said first and third electrodes are on opposite sides of said array from said second and fourth electrodes, and said first electrode acts as a port, said second and third electrodes are connected to ground and said fourth electrode acts as a port.

39. The RF filter as recited in claim 34, wherein said portion of said first electrode which extends overtop of said array includes a first set of teeth, said portion of said second electrode which extends overtop of said array includes a second set of teeth, said first set of teeth extending at least partially into gaps formed between the teeth of said second set of teeth without said first and second electrodes contacting.

40. The RF filter as recited in claim 39, further comprising a magnet providing a magnetic field in a direction parallel to the carbon nanotubes of said carbon nanotube array.

41. The RF filter as recited in claim 34, wherein said first and second electrodes comprise strip-line type electrodes.

42. The RF filter as recited in claim 41, wherein said portion of said first electrode which extends overtop of said array includes a first set of teeth, said portion of said second electrode which extends overtop of said array includes a second set of teeth.

43. The RF filter as recited in claim 34, wherein said substrate comprises a dielectric material.

44. The RF filter as recited in claim 34, wherein said dielectric layer has a thickness equal to the height of the carbon nanotubes of said carbon nanotube array.

45. The RF filter as recited in claim 34, wherein said first electrode acts as a port and said second electrode is connected to ground.

46. The RF filter as recited in claim 45, wherein said portion of said first electrode which extends overtop of said array includes a first set of teeth, said portion of said second electrode which extends overtop of said array includes a second set of teeth, said first set of teeth extending at least partially into gaps formed between the teeth of said second set of teeth without said first and second electrodes contacting.

47. The RF filter as recited in claim 46, further comprising a magnet providing a magnetic field in a direction parallel to the carbon nanotubes of said carbon nanotube array.

48. A method for filtering a radio frequency (RF) signal, comprising steps of:
providing a carbon nanotube array;
providing an input and output to said carbon nanotube array;
voltage biasing said carbon nanotube array;
providing a magnetic field parallel to carbon nanotubes of said carbon nanotube array; and
providing said RF signal to said input of said carbon nanotube array.

49. The method as recited in claim 48, wherein said input and output to said carbon nanotube array comprise quasi-coplanar waveguides.

50. The method as recited in claim 48, wherein said input and output to said carbon nanotube array comprise strip-lines.

51. The method as recited in claim 50, wherein said strip-lines include a plurality of teeth extending, at least partially over said carbon nanotube array.

52. The method as recited in claim 51, further comprising a step of selecting a number of teeth of said plurality of teeth based on a desired frequency response for said filter.

53. The method as recited in claim 52, further comprising a step of tuning said filter by adjusting a strength of at least one of said voltage bias and said magnetic field.

54. The method as recited in claim 48, wherein said input and output to said carbon nanotube array comprise interdigital electrodes.

55. The method as recited in claim 54, wherein said interdigital electrodes include a plurality of teeth extending, at least partially over said carbon nanotube array.

56. The method as recited in claim 55, further comprising a step of selecting a number of teeth of said plurality of teeth based on a desired frequency response for said filter.

57. The method as recited in claim 56, further comprising a step of tuning said filter by adjusting a strength of at least one of said voltage bias and said magnetic field.

58. A method for fabricating a radio frequency (RF) filter, comprising steps of:
    forming a dielectric layer onto a first substrate;
    removing a portion of said dielectric layer;
    forming a first conductor layer onto the portion exposed by said removing step;
    forming a carbon nanotube array onto said first conductor;
    forming second and third conductor layers onto said dielectric layer and a signal input and output to said carbon nanotube array;
    bonding a second substrate on top of said second and third conductor layers; and
    forming a fourth conductor layer on top of said second substrate.

59. The method as recited in claim 58, further comprising a step of forming first and second interdigital electrodes onto said second substrate before said bonding step, and wherein said bonding step is such that said first and second interdigital electrodes are connected with said second and third conductors respectively.

60. The method as recited in claim 59, wherein said carbon nanotubes are formed such that tips of each nanotubes do not extend above said second and third conductor layers, and said first and second interdigital electrodes each include a plurality of teeth extending, at least partially over said carbon nanotube array, after bonding.

61. The method as recited in claim 60, further comprising a step of selecting a number of teeth of each said plurality of teeth based on a desired frequency response for said RF filter, said teeth formed such that said first plurality of teeth are formed in gaps between said second plurality of teeth, without said first plurality of teeth contacting said second plurality of teeth.

62. The method as recited in claim 60, wherein said first conductor layer is connected to ground and said fourth conductor layer is set to a DC voltage potential.

63. The method as recited in claim 58, wherein said first conductor layer is connected to ground and said fourth conductor layer is set to a DC voltage potential.

64. A structure that is capable of being used in a filter or a resonator, comprising:
    a dielectric layer formed on a substrate;
    a ground plane formed on said substrate in a well in said dielectric layer;
    a carbon nanotube array formed on said ground plane;
    first and second electrodes formed on first and second portions of said dielectric layer and extending at least partially over said carbon nanotube array, such that an RF signal may be input to and output from said carbon nanotube array via at least one of said first and second electrodes; and
    a third electrode disposed over said carbon nanotube array.

* * * * *